(12) United States Patent
Finder et al.

(10) Patent No.: US 6,559,471 B2
(45) Date of Patent: May 6, 2003

(54) QUANTUM WELL INFRARED PHOTODETECTOR AND METHOD FOR FABRICATING SAME

(75) Inventors: Jeffrey M. Finder, Chandler; William J. Ooms, Prescott, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/733,688

(22) Filed: Dec. 8, 2000

(65) Prior Publication Data

US 2002/0072140 A1 Jun. 13, 2002

(51) Int. Cl.[7] .................. H01L 29/06; H01L 31/0328; H01L 31/0336
(52) U.S. Cl. .................. 257/22; 257/9; 257/14; 257/15
(58) Field of Search .................. 257/14, 22, 15, 257/615

(56) References Cited

U.S. PATENT DOCUMENTS

| | | | |
|---|---|---|---|
| 3,670,213 A | 6/1972 | Nakagawa et al. | 257/449 |
| 4,242,595 A | 12/1980 | Lehovec | 326/132 |

(List continued on next page.)

FOREIGN PATENT DOCUMENTS

| | | | |
|---|---|---|---|
| DE | 197 12 496 | 10/1997 | |
| EP | 0 581 239 | 2/1994 | |
| EP | 1 109 212 | 6/2001 | |
| JP | 60-210018 | 10/1985 | |
| JP | 60212018 | * 10/1985 | H03H/9/25 |
| JP | 1052329 | * 2/1989 | H01B/12/06 |
| JP | 64-50575 | 2/1989 | |
| JP | 64-52329 | 2/1989 | |
| JP | 1-102435 | 4/1989 | |
| JP | 0812494 | 1/1996 | |
| JP | 10-303396 | 11/1998 | |
| JP | 2 000 1645 | 6/2000 | |
| WO | WO 94/03908 | 2/1994 | |
| WO | WO 98/05807 | 1/1998 | |
| WO | 9914804 | 3/1999 | H01L/21/258 |
| WO | WO 01/33585 | 5/2001 | |

OTHER PUBLICATIONS

"Optimizing GMR Spin Valves: The Outlook for Improved Properties", W. F. Engihoff et al., 1998 Int'l Non Volatile Memory Technology Conference, pp. 34–37.

(List continued on next page.)

Primary Examiner—Nathan J. Flynn
Assistant Examiner—Scott R Wilson
(74) Attorney, Agent, or Firm—Oblon, Spivak, McClelland, Maier & Neustadt, P.C.

(57) ABSTRACT

High quality epitaxial layers of monocrystalline materials can be grown overlying monocrystalline substrates such as large silicon wafers by forming a compliant substrate for growing the monocrystalline layers. One way to achieve the formation of a compliant substrate includes first growing an accommodating buffer layer (204) on a silicon wafer (202). The accommodating buffer layer is a layer of monocrystalline oxide spaced apart from the silicon wafer by an amorphous interface layer (206) of silicon oxide. The amorphous interface layer dissipates strain and permits the growth of a high quality monocrystalline oxide accommodating buffer layer. The accommodating buffer layer is lattice matched to both the underlying silicon wafer and the overlying monocrystalline layer. Any lattice mismatch between the accommodating buffer layer and the underlying silicon substrate is taken care of by the amorphous interface layer. In addition, formation of a compliant substrate may include utilizing surfactant enhanced epitaxy, epitaxial growth of single crystal silicon onto single crystal oxide, and epitaxial growth of Zintl phase materials. Quantum well infrared photodetectors (200) can be grown on the high quality epitaxial monocrystalline material formed on such compliant substrates to create highly reliable devices having reduced costs.

39 Claims, 6 Drawing Sheets

U.S. PATENT DOCUMENTS

| | | | |
|---|---|---|---|
| 4,289,920 A | 9/1981 | Hovel | 136/246 |
| 4,398,342 A | 8/1983 | Pitt et al. | 438/3 |
| 4,424,589 A | 1/1984 | Thomas et al. | 382/317 |
| 4,459,325 A | 7/1984 | Nozawa et al. | 438/400 |
| 4,482,422 A | 11/1984 | McGinn et al. | 117/95 |
| 4,748,485 A | 5/1988 | Vasudev | 257/353 |
| 4,756,007 A | 7/1988 | Qureshi et al. | 375/259 |
| 4,772,929 A | 9/1988 | Manchester et al. | 257/422 |
| 4,773,063 A | 9/1988 | Hunsperger et al. | 359/130 |
| 4,841,775 A | 6/1989 | Ikeda et al. | 73/704 |
| 4,845,044 A | 7/1989 | Ariyoshi et al. | 438/480 |
| 4,882,300 A | 11/1989 | Inoue et al. | 437/236 |
| 4,901,133 A | 2/1990 | Curran et al. | 257/637 |
| 4,984,043 A | 1/1991 | Vinal | 257/365 |
| 4,999,842 A | 3/1991 | Huang et al. | 372/45 |
| 5,051,790 A | 9/1991 | Hammer | 257/80 |
| 5,055,445 A | 10/1991 | Belt et al. | 505/452 |
| 5,073,981 A | 12/1991 | Giles et al. | 359/174 |
| 5,081,519 A | 1/1992 | Nishimura et al. | 257/200 |
| 5,140,651 A | 8/1992 | Soref et al. | 385/2 |
| 5,155,658 A | 10/1992 | Inam et al. | 361/321 |
| 5,185,589 A | 2/1993 | Krishnaswamy et al. | 333/133 |
| 5,194,397 A | 3/1993 | Cook et al. | 438/684 |
| 5,204,870 A * | 4/1993 | Faist et al. | 372/45 |
| 5,225,031 A | 7/1993 | McKee et al. | 156/612 |
| 5,227,196 A | 7/1993 | Itoh | 427/249.1 |
| 5,248,564 A | 9/1993 | Ramesh | 428/688 |
| 5,270,298 A | 12/1993 | Ramesh | 505/1 |
| 5,281,834 A | 1/1994 | Cambou et al. | 257/200 |
| 5,310,707 A | 5/1994 | Oishi et al. | 501/126 |
| 5,314,547 A | 5/1994 | Heremans et al. | 148/33.1 |
| 5,326,721 A | 7/1994 | Summerfelt | 437/131 |
| 5,352,926 A | 10/1994 | Andrews | 257/717 |
| 5,356,509 A | 10/1994 | Terranova et al. | 117/58 |
| 5,394,489 A | 2/1995 | Koch | 385/14 |
| 5,406,202 A | 4/1995 | Mehrgardt et al. | 324/251 |
| 5,418,389 A | 5/1995 | Watanabe | 257/295 |
| 5,441,577 A | 8/1995 | Sasaki et al. | 136/244 |
| 5,453,727 A | 9/1995 | Shibasaki et al. | 338/32 R |
| 5,466,631 A | 11/1995 | Ichikawa et al. | 438/406 |
| 5,473,047 A | 12/1995 | Shi | 528/310 |
| 5,486,406 A | 1/1996 | Shi | 428/209 |
| 5,491,461 A | 2/1996 | Partin et al. | 338/32 R |
| 5,492,859 A | 2/1996 | Sakaguchi et al. | 438/459 |
| 5,494,711 A | 2/1996 | Takeda et al. | 427/473 |
| 5,504,035 A | 4/1996 | Rostoker et al. | 228/180.22 |
| 5,504,183 A | 4/1996 | Shi | 528/272 |
| 5,511,238 A | 4/1996 | Bayraktaroglu | 455/81 |
| 5,515,047 A | 5/1996 | Yamakido et al. | 341/153 |
| 5,515,810 A | 5/1996 | Yamashita et al. | 117/17 |
| 5,528,057 A | 6/1996 | Yanagase et al. | 257/96 |
| 5,528,067 A | 6/1996 | Farb | 257/401 |
| 5,549,977 A | 8/1996 | Jin et al. | 428/692 |
| 5,552,547 A | 9/1996 | Shi | 546/7 |
| 5,572,052 A | 11/1996 | Kashihara et al. | 257/295 |
| 5,596,205 A | 1/1997 | Reedy et al. | 257/9 |
| 5,602,418 A | 2/1997 | Imai et al. | 257/627 |
| 5,610,744 A | 3/1997 | Ho et al. | 359/113 |
| 5,650,646 A | 7/1997 | Summerfelt | 257/295 |
| 5,656,382 A | 8/1997 | Nashimoto | 428/620 |
| 5,659,180 A | 8/1997 | Shen et al. | 257/25 |
| 5,674,366 A | 10/1997 | Hayashi et al. | 204/298.09 |
| 5,679,965 A | 10/1997 | Schetzina | 257/103 |
| 5,731,220 A | 3/1998 | Tsu et al. | 437/60 |
| 5,754,319 A | 5/1998 | Van De Voorde et al. | 359/109 |
| 5,777,350 A | 7/1998 | Nakamura et al. | 257/96 |
| 5,789,845 A | 8/1998 | Wadaka et al. | 310/334 |
| 5,792,679 A | 8/1998 | Nakato | 310/334 |
| 5,801,072 A | 9/1998 | Barber | 438/107 |
| 5,801,105 A | 9/1998 | Yano et al. | 438/785 |
| 5,825,055 A | 10/1998 | Summerfelt | 257/183 |
| 5,827,755 A | 10/1998 | Yonchara et al. | 438/30 |
| 5,828,080 A | 10/1998 | Yano et al. | 257/43 |
| 5,833,603 A | 11/1998 | Kovacs et al. | 600/317 |
| 5,863,326 A | 1/1999 | Nause et al. | 117/217 |
| 5,872,493 A | 2/1999 | Ella | 333/191 |
| 5,874,860 A | 2/1999 | Brunel et al. | 330/285 |
| 5,883,564 A | 3/1999 | Partin | 338/32 R |
| 5,907,792 A | 5/1999 | Droopad et al. | 438/791 |
| 5,912,068 A * | 6/1999 | Jia | 428/210 |
| 5,948,161 A | 9/1999 | Kizuki | 117/89 |
| 5,959,879 A | 9/1999 | Koo | 365/145 |
| 5,987,011 A | 11/1999 | Toh | 370/331 |
| 6,002,375 A | 12/1999 | Corman et al. | 343/853 |
| 6,011,646 A | 1/2000 | Mirkarimi et al. | 359/359 |
| 6,022,140 A | 2/2000 | Fraden et al. | 374/158 |
| 6,023,082 A | 2/2000 | McKee et al. | 257/295 |
| 6,028,853 A | 2/2000 | Haartsen | 370/338 |
| 6,049,702 A | 4/2000 | Tham et al. | 455/78 |
| 6,055,179 A | 4/2000 | Koganei et al. | 365/158 |
| 6,078,717 A | 6/2000 | Nashimoto et al. | 385/130 |
| 6,103,008 A | 8/2000 | McKee et al. | 117/2 |
| 6,108,125 A | 8/2000 | Yano | 359/344 |
| 6,153,010 A | 11/2000 | Kiyoku et al. | 117/225 |
| 6,153,454 A | 11/2000 | Krivokapic | 438/95 |
| 6,175,497 B1 | 1/2001 | Tseng et al. | 361/704 |
| 6,175,555 B1 | 1/2001 | Hoole | 370/280 |
| 6,184,044 B1 | 2/2001 | Sone et al. | 438/3 |
| 6,191,011 B1 | 2/2001 | Gilboa et al. | 438/488 |
| 6,204,737 B1 | 3/2001 | Ella | 333/187 |
| 6,224,669 B1 | 5/2001 | Yi et al. | 117/108 |
| 6,239,449 B1 | 5/2001 | Fafard et al. | 257/17 |
| 6,241,821 B1 | 6/2001 | Yu et al. | 117/108 |
| 6,248,459 B1 | 6/2001 | Wang et al. | 428/700 |
| 6,252,261 B1 | 6/2001 | Usui et al. | 257/190 |
| 6,255,198 B1 | 7/2001 | Linthicum et al. | 438/481 |
| 6,291,319 B1 | 9/2001 | Yu et al. | 438/481 |
| 6,139,483 A1 * | 10/2001 | Seabaugh et al. | 498/503 |
| 6,313,486 B1 | 11/2001 | Kencke et al. | 257/192 |
| 6,316,785 B1 | 11/2001 | Nunoue et al. | 257/14 |
| 6,316,832 B1 | 11/2001 | Tsuzuki et al. | 257/747 |
| 6,343,171 B1 | 1/2002 | Yoshimura et al. | 385/50 |
| 2001/0013313 A1 | 8/2001 | Droopad et al. | 117/200 |

OTHER PUBLICATIONS

"Processing and Performance of Piezoelectric Films", Y. Wang et al., Univ. of MD, Wilcoxon Research Co., and Motorola Labs.

"Nonlinear acoustoelectric interactions in GaAs/LiNbO$_3$ structures", M. Rotter et al., 1999 American Institute of Physics, pp. 965–967.

"Surface acoustic wave propagation on lead zirconate titanate thin films", K. Sreenivas et al., App. Phys. Lett. 52(9), Feb. 29, 1988, pp. 709–711.

"Single Chip fused hybrids for acousto–electric and acousto–optic applications", M. Rotter et al., 1997 American Institute of Physics, pp. 2097–2099.

"Surface Acoustic Wave Propagation in PZT/YBCO/SrTiO$_3$ and PbTi O$_3$/YBCO/SrTiO$_3$ Epitaxial Heterostructures", Dept. of Physics & Astrophysics, Univ. of Delhi, pp. 275–283.

"Ferroelectric Field Effect Transisitor Based on Epitaxial Perovskite Heterostructures", S. Mathews et al., American Association for the Advancement of Science, 1997, pp. 238–240.

"Formation of Si Epi./MgO–Al$_2$O$_3$ Epi./SiO$_3$/Si and Its Epitaxial Film Quality," Masao Mikami et al., Fundamental Research Laboratories and Microelectronics Laboratories, pp. 31–34.

"An Epitaxial Si/Insulator/Si Structure Prepared by Vacuum Deposition of CaF$_2$ and Silicon," T. Asano et al., Graduate School of Science and Engineering, Tokyo Institute of Technology, pp. 143–151.

"Reaction and Regrowth Control of $CeO_2$ on Si(111) Surface for the Silicon–On–Insulator Structure," T. Chikyow et al., Appl. Phys. Lett. 65(8), Aug. 22, 1994, pp. 1030–1032.

"Epitaxial Growth of $CeO_2$(100) Films on Si(100) Substrates by Dual Ion Beams Reactive Sputtering," J.F. Kang et al., Solid State Communications, vol. 108, No. 4, pp. 225–227.

"Vertical–Cavity Surface–Emitting Lasers Come of Age," Robert A. Morgan et al., SPIE, vol. 2683, pp. 18–29.

"Technical Analysis of Qualcomm QCP–800 Portable Cellular Phone(Transmitter Circuitry)," Talus Corporation, Qualcomm QCP–800 Technical Analysis Report, Dec. 10, 1996, pp. 5–8.

"Properties of GaAs Si Grown by Molecular Beam Epitaxy, "R. Houdre et al., Solid State and Molecular Sciences, 1990, pp. 91–114.

"Gallium Arsenide and Other Compound Semiconductors on Silicon," S.F. Fang et al., J. Appl. Phys. 68(7), Oct. 1, 1990, pp. R31–R58.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59(1991) Jul. 8 No. 2; pp. 201–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1999) R169–R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143–14146.

Q.–Y. Tong et al.; "IOS–a new type of meterials combination for system–on–a chip preparation"; 1999 IEEE International SOI Conference, Oct. 1999; pp. 104–105.

T. Kanniainen et al.; "Growth of Dielectric 1hfo2/Ta2O5 Thin Film Nanolaminate Capacitors by Atomic Layer Epitaxy"; Electrochemical Society Proceedings, U.S. Electrochemical Society; Pennington, N.J.; Aug. 31, 1997; pp. 36–45.

Myung Bok Lee; "Formation and Characterization of Epitaxial $TiO_2$ and $BaTiO_3/TiO_2$ Films on Si Substrate"; Japan Journal Applied Physics Letters; vol. 34; 1995; pp. 808–811.

K. Elsenbeiser; "Field Effect Transistors with $SrTiO_3$ Gate Dielectric on Si"; Applied Physics Letters; vol. 76, No. 10; Mar. 6, 2000; pp. 1324–1326.

Stephen A. Mass; "Microwave Mixers"; Second Edition; 2pp.

Douglas J. Hamilton et al.; "Basic Integrated Circuit Engineering"; pp.2; 1975.

Takeshi Obata; "Tunneling Magnetoresistance at Up to 270 K in $La_{0.8}Sr_{0.2}MnO_3$/Sr $TiO_3$/$La_{0.8}Sr_{0.2}MnO_3$ Junctions with 1.6–nm–Thick Barriers"; Applied Physics Letters; vol. 74, No. 2; Jan. 11, 1999; pp. 290–292.

Wei Zhang et al.; "Enhanced Magnetoresistance in La–Ca–Mn–O Films on Si Substrates Using $YbaCuO/CeO_2$ Heterostructures"; Physics C; vol. 282–287, No. 2003; Aug. 1, 1997; pp. 1231–1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependence of the Magnetization Reversal in Co(fcc)–BN–Co(poly hcp) Structures"; Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design on $ZnO/SiO_2$/Si Monolithic Integrated Programmable SAW Filter"; Proceedings of Fifth International Conference on Solid–State and Integrated Circuit Technology; 21–23; Oct. 1998; pp. 826–829.*

Kirk–Othmer Encyclopedia of Chemical Technology; Fourth Edition, vol.12; Fuel Resources to Heat Stabilizers; A Wiley–Interscience Publication; John Wiley & Sons.*

John W. Goodman et al; "Optical Interconnections For VLSI Systems"; Proceedings of the IEEE, vol. 72, No. 7, Jul. 1984.*

Fathimulia et al.; "Monolithic Integration of InGaAs/InAlAs MODFETs and RTDs on InP–bonded–to Si Substrate"; Fourth International Conference on Indium Phosphide and Realted Materials, Newport, RI, USA; Apr. 21—24, 1992 ; pp. 167–170; XP000341253; IEEE, New York, NY, USA; ISBN; 0–1803–0522–1.*

Pierret, R. F.; "1/j–FET and MSFET"; Field Effect Devices; MA, Addison–Wesley; 1990; pp. 9–22.*

M. Schreiter, et al.; "Sputtering of Self–Polarized PZT Films for IR–Detector Arrays"; 1998 IEEE; pp. 181–185.*

Hideaki Adachi et al.; "Sputtering Preparation of Ferroelectic PLZT Thin Films and Their Optical Applications"; IEEE Transactions of Ultrasonics, Ferroelectrics and Frequency Control, vol. 38, No. 6, Nov. 1991.*

A.J. Moulson et al.; "Electronics Materials Properties Applications"; Chapman & Hall; pp. 366–369.*

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.*

Wang et al.; "Depletion–Mode GaAs MOSFETs with Negligible Drain Current Drift and Hysteresis"; Electron Devices Meeting, 1998, IEDM '98 Technical Digest; pp. 67–70.*

Ben G. Streetman; "Solid State Electronics Devices"; 10990, Prentice Hall; Third Edition; pp. 320–322.*

A.Y Wu et al.; "Highly Oriented $(Pb,La)(Zr,Ti)O_3$ Thin Films on Amorphous Substrates"; IEEE, 1992; pp. 301–304.*

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321–326.*

Zhu et al., "Molecular Beam Epitaxy of GaAs on Si–On–Insulator", Applied Physics Letters 59(1991) Jul. 8 No. 2, pp. 210–212.*

* cited by examiner

QUANTUM WELL INFRARED PHOTODETECTOR AND METHOD FOR FABRICATING SAME

FIELD OF THE INVENTION

This invention relates generally to semiconductor structures and devices and to a method for their fabrication, and more specifically to multiple quantum well infrared photodetectors formed using Group III–V and/or Group II–VI periodic table material combinations grown on a compliant substrate.

BACKGROUND OF THE INVENTION

Semiconductor devices typically include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases.

For many years, attempts have been made to grow various monolithic thin films on a foreign substrate, such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material was available at low cost, a variety of semiconductor devices could advantageously be fabricated in that film at a low cost compared to the cost of fabricating such devices beginning with a bulk wafer of semiconductor material or in an epitaxial film of such material on a bulk wafer of semiconductor material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Accordingly, a need exists for a semiconductor structure that provides a high quality monocrystalline film or layer over another monocrystalline material and for a process for making such a structure.

This structure and process could have extensive applications. One such application of this structure and process involves the formation of quantum well infrared photodetectors. Recently, multi-quantum well structures built using multiple layers of semiconductor materials with alternating band gaps have proven to be applicable in building quantum well infrared photodetectors (QWIPs). An advantage of QWIPs is that they have the ability to sense multiple wavelengths of radiation and output current according to the wavelength absorbed. However, present-day QWIPs are expensive due to high-cost substrates and the requirement of separate CMOS circuits required to sense the output of each QWIP array element.

Accordingly, a need exists for a low cost quantum well infrared photodetector and a process for making the same.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Figure 1:
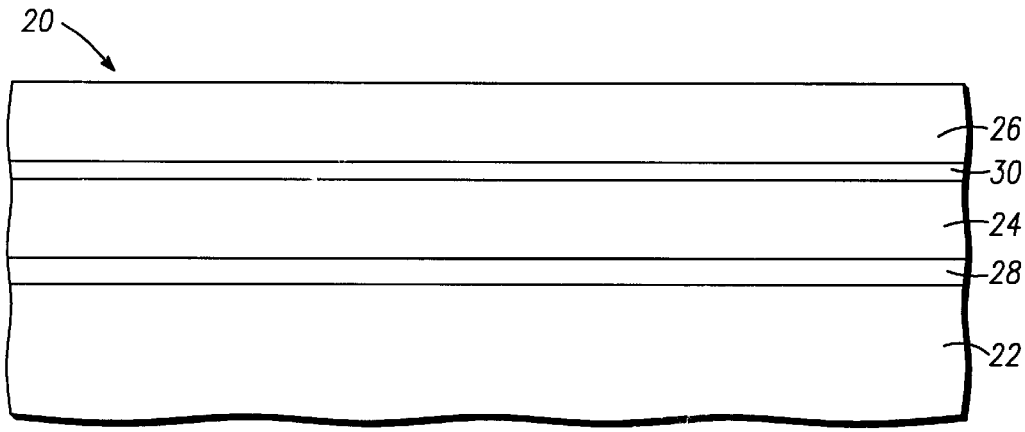
FIGS. 1–3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26, which may comprise a semiconductor material, a compound semiconductor material, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tinbased perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The material for monocrystalline material layer 26 can be selected, as desired, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. However, monocrystalline material layer 26 may also comprise other semiconductor materials, metals, or non-metal materials which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

Figure 2:
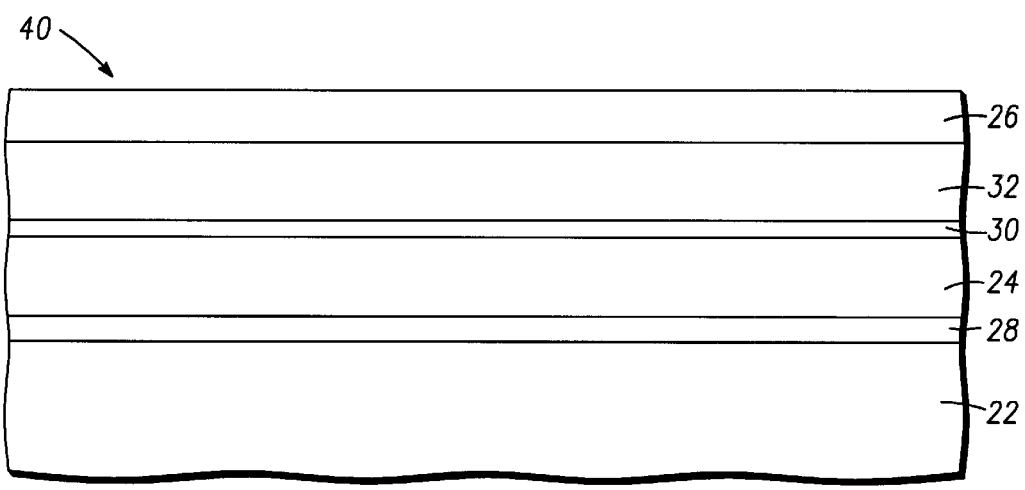

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26. Specifically, the additional buffer layer is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
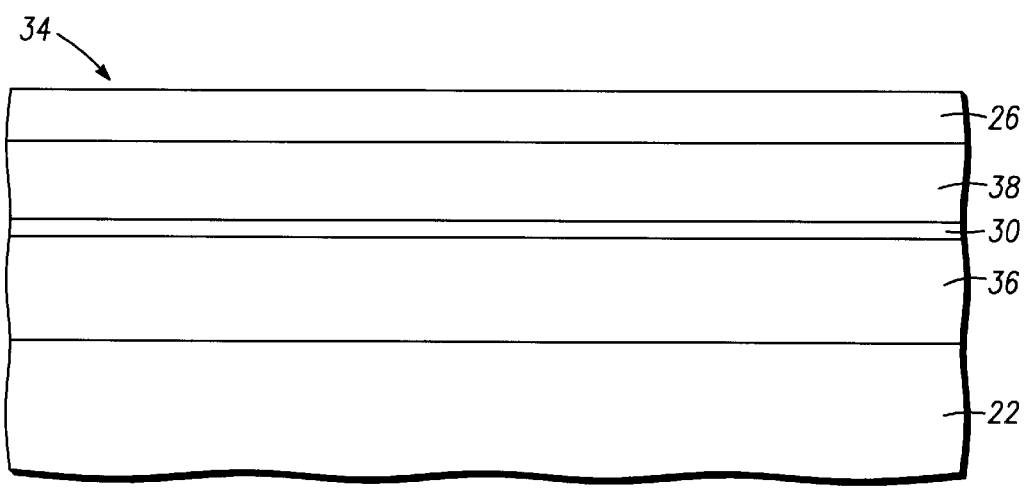

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides a true compliant substrate for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV or monocrystalline compound semiconductor materials.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) that is thick enough to form devices within layer 38. In this case, a semiconductor structure in accordance with the present invention does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended hat the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}O_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 5 nm. In general, it is desired to have an accommodating buffer layer thick enough to isolate the compound semiconductor layer from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1–2 nm.

In accordance with this embodiment of the invention, monocrystalline material layer 26 is a compound semiconductor layer of gallium arsenide (GaAs) or aluminum gallium arsenide (AlGaAs) having a thickness of about 1 nm to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been shown to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of a monocrystalline material layer which comprises compound semiconductor materials in the indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 $\mu$m. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontiumoxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. Where the monocrystalline layer comprises a compound semiconductor material, the II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, accommodating buffer layer 24, and monocrystalline material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying monocrystalline material which in this example is a compound semiconductor material. The compositions of other compound semiconductor materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline material layer which in this example is a compound semiconductor material. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 1, accommodating buffer layer 24, monocrystalline material layer 26 and template layer 30 can be the same as those described above in example 2. In addition, additional buffer layer 32 is inserted between the accommodating buffer layer and the overlying monocrystalline material layer. The buffer layer, a further monocrystalline material which in this instance comprises a semiconductor material, can be, for example, a graded layer of indium gallium arsenide (InGaAs) or indium aluminum arsenide (InAlAs). In accordance with one aspect of this embodiment, additional buffer layer 32 includes $In_xGaAs$, in which the indium composition varies from 0 to about 50%. The additional buffer layer 32 preferably has a thickness of about 10–30 nm. Varying the composition of the buffer layer from GaAs to InGaAs serves to provide a lattice match between the underlying monocrystalline oxide material and the overlying layer of monocrystalline material which in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above).

For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
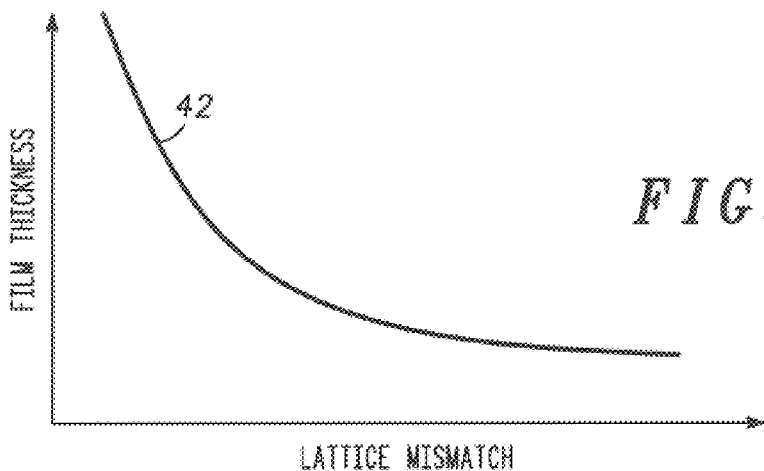
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown monocrystalline material layer can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 4° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 850° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 850° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in a accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with 1–2 monolayers of titanium, 1–2 monolayers of titanium-oxygen or with 1×2 monolayers of strontium-oxygen. Following the formation of this capping layer, arsenic is deposited to form a Ti—As bond, a Ti—O—As bond or a Sr—O—As bond. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
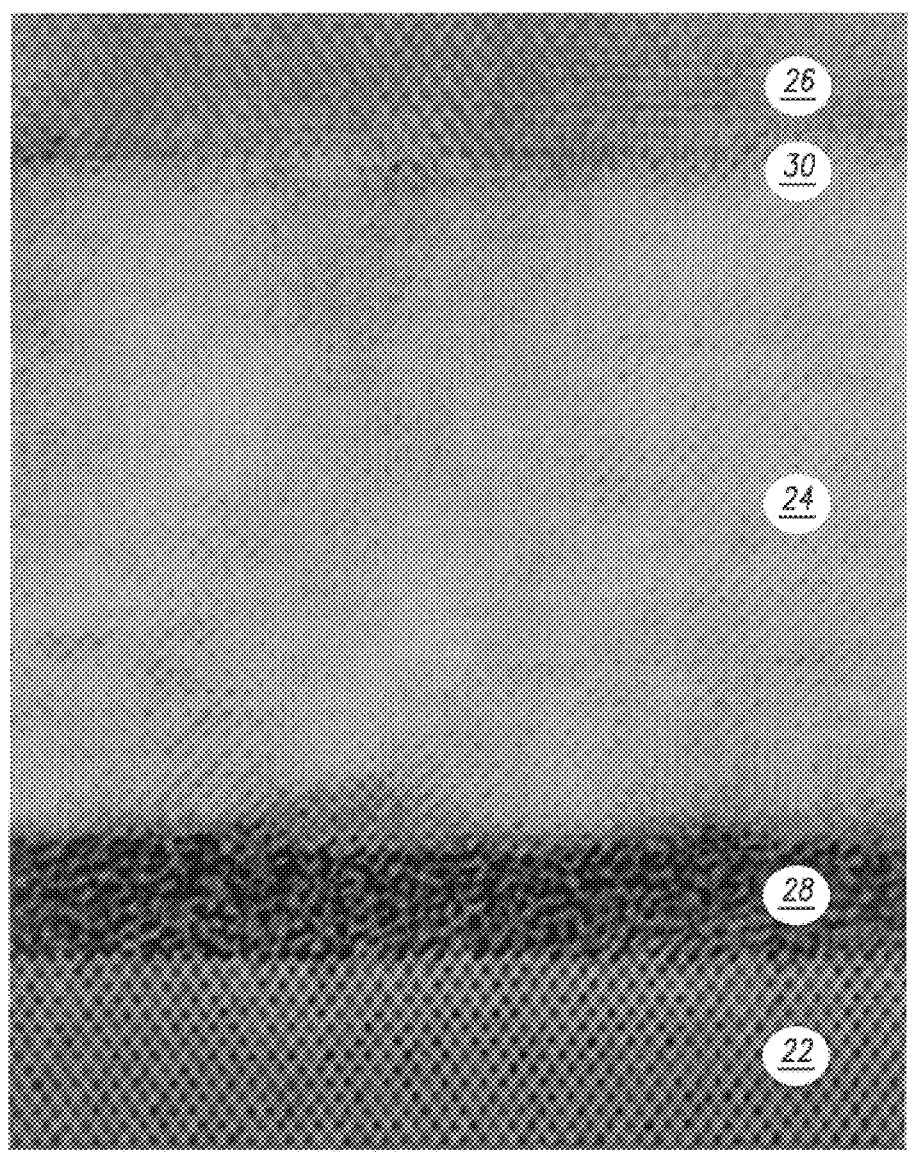
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with one embodiment of the present invention. Single crystal SrTiO$_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
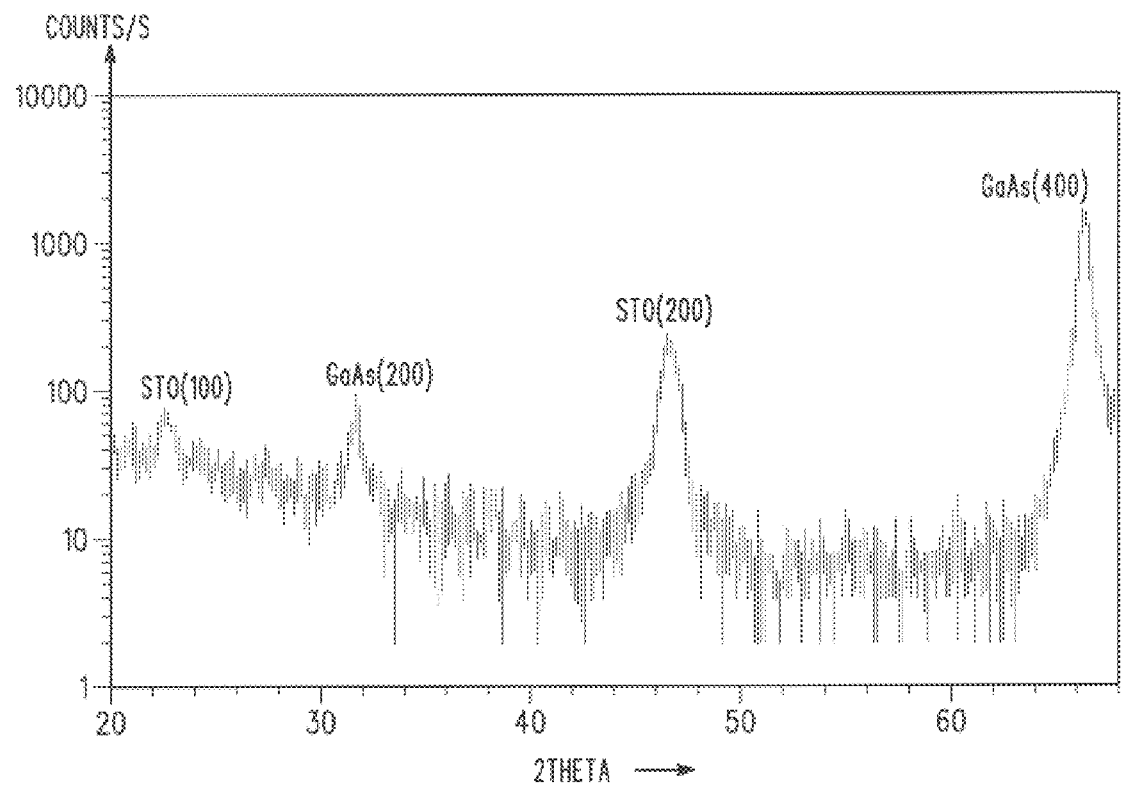
FIG. 6 illustrates an x-ray diffraction spectrum of a structure including a monocrystalline accommodating buffer layer.

FIG. 6 illustrates an x-ray diffraction spectrum taken on a structure including monocrystalline layer 26 comprising GaAs grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The additional buffer layer 32 is formed overlying the template layer before the deposition of the monocrystalline material layer. If the buffer layer is a monocrystalline material layer comprising a compound semiconductor superlattice, such a superlattice can be deposited, by MBE for example, on the template described above. If instead the buffer layer is a monocrystalline material layer comprising a layer of germanium, the process above is modified to cap the strontium titanate monocrystalline layer with a final layer of either strontium or titanium and then by depositing germanium. to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and monocrystalline layer 38 to a rapid thermal anneal process with a peak temperature of about 700° C. to about 1000° C. and a process time of about 5 seconds to about 10 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
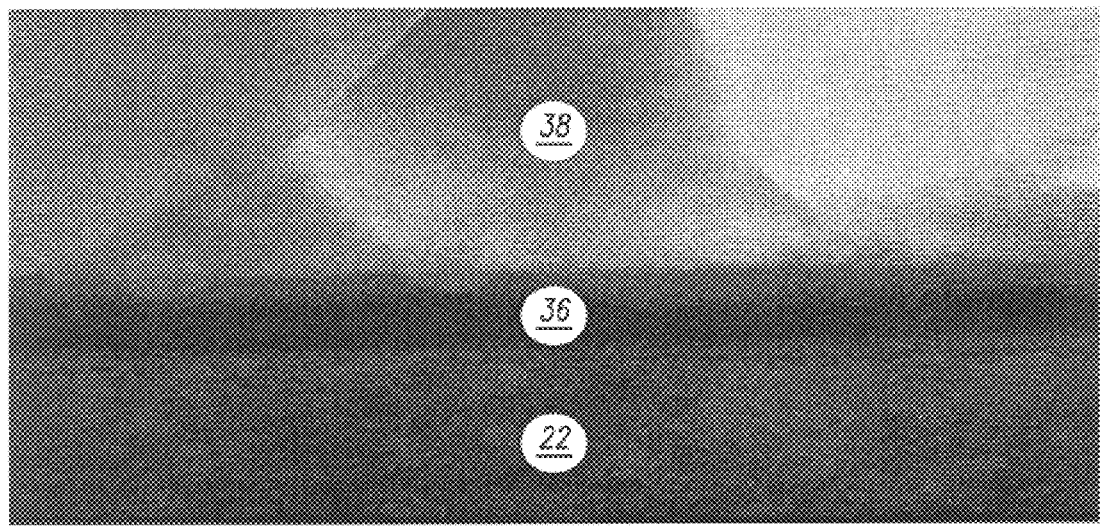
FIG. 7 illustrates a high resolution Transmission Electron Micrograph of a structure including an amorphous oxide layer.

FIG. 7 is a high resolution Transmission Electron Micrograph (TEM) of semiconductor material manufactured in accordance with the embodiment of the invention illustrated in FIG. 3. In accordance with this embodiment, a single crystal SrTiO$_3$ accommodating buffer layer was grown epitaxially on silicon substrate 22. During this growth process, an amorphous interfacial layer forms as described above. Next, additional monocrystalline layer 38 comprising a compound semiconductor layer of GaAs is formed above the accommodating buffer layer and the accommodating buffer layer is exposed to an anneal process to form amorphous oxide layer 36.

Figure 8:
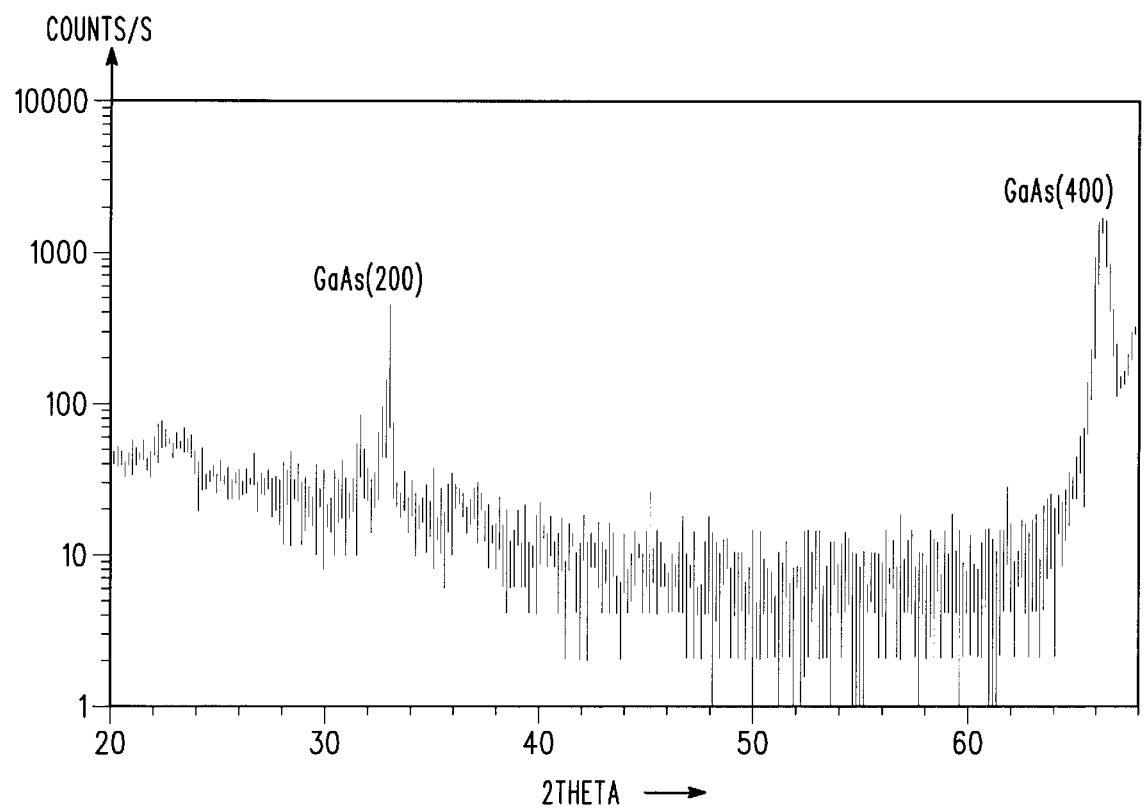
FIG. 8 illustrates an x-ray diffraction spectrum of a structure including an amorphous oxide layer.

FIG. 8 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, perovskite oxides such as alkaline earth metal tin-based perovskites, lanthanum aluminate, lanthanum scandium oxide, and gadolinium oxide can also be grown. Further, by a similar process such as MBE, other monocrystalline material layers comprising other III–V and II–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a monocrystalline material layer comprising indium gallium arsenide, indium aluminum arsenide, or indium phosphide.

The formation of a device structure in accordance with another embodiment of the invention is illustrated schematically in cross-section in FIGS. 9A–9D. Like the previously described embodiments referred to in FIGS. 1–3, this embodiment of the invention involves the process of forming a compliant substrate utilizing the epitaxial growth of single crystal oxides, such as the formation of accommodating buffer layer 24 previously described with reference to FIGS. 1 and 2 and amorphous layer 36 previously described with reference to FIG. 3, and the formation of a template layer 30. However, the embodiment illustrated in FIGS. 9A–9D utilizes a template that includes a surfactant to facilitate layer-by-layer monocrystalline material growth.

Figure 9A:
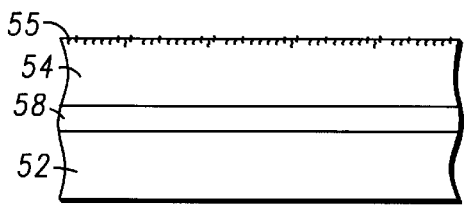
FIGS. 9A–9D illustrate schematically, in cross-section, the formation of a device structure in accordance with another embodiment of the invention.

Turning now to FIG. 9A, an amorphous intermediate layer 58 is grown on substrate 52 at the interface between substrate 52 and a growing accommodating buffer layer 54, which is preferably a monocrystalline crystal oxide layer, by the oxidation of substrate 52 during the growth of layer 54. Layer 54 is preferably a monocrystalline oxide material such as a monocrystalline layer of $Sr_zBa_{1-z}TiO_3$ where z ranges from 0 to 1. However, layer 54 may also comprise any of those compounds previously described with reference layer 24 in FIGS. 1–2 and any of those compounds previously described with reference to layer 36 in FIG. 3 which is formed from layers 24 and 28 referenced in FIGS. 1 and 2.

Figure 9B:
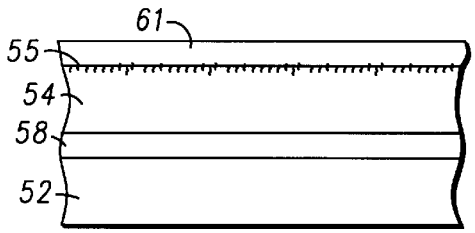
Figure 9C:
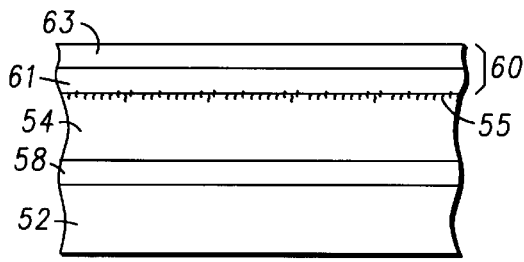

Layer 54 is grown with a strontium (Sr) terminated surface represented in FIG. 9A by hatched line 55 which is followed by the addition of a template layer 60 which includes a surfactant layer 61 and capping layer 63 as illustrated in FIGS. 9B and 9C. Surfactant layer 61 may comprise, but is not limited to, elements such as Al, In and Ga, but will be dependent upon the composition of layer 54 and the overlying layer of monocrystalline material for optimal results. In one exemplary embodiment, aluminum (Al) is used for surfactant layer 61 and functions to modify the surface and surface energy of layer 54. Preferably, surfactant layer 61 is epitaxially grown, to a thickness of one to two monolayers, over layer 54 as illustrated in FIG. 9B by way of molecular beam epitaxy (MBE), although other epitaxial processes may also be performed including chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like.

Surfactant layer 61 is then exposed to a halogen such as arsenic, for example, to form capping layer 63 as illustrated in FIG. 9C. Surfactant layer 61 may be exposed to a number of materials to create capping layer 63 such as elements which include, but are not limited to, As, P, Sb and N. Surfactant layer 61 and capping layer 63 combine to form template layer 60.

Figure 9D:
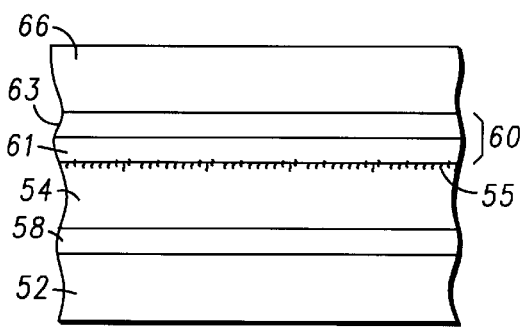

Monocrystalline material layer 66, which in this example is a compound semiconductor such as GaAs, is then deposited via MBE, CVD, MOCVD, MEE, ALE, PVD, CSD, PLD, and the like to form the final structure illustrated in FIG. 9D.

FIGS. 10A–10D illustrate possible molecular bond structures for a specific example of a compound semiconductor structure formed in accordance with the embodiment of the invention illustrated in FIGS. 9A–9D. More specifically, FIGS. 10A–10D illustrate the growth of GaAs (layer 66) on the strontium terminated surface of a strontium titanate monocrystalline oxide (layer 54) using a surfactant containing template (layer 60).

The growth of a monocrystalline material layer 66 such as GaAs on an accommodating buffer layer 54 such as a strontium titanium oxide over amorphous interface layer 58 and substrate layer 52, both of which may comprise materials previously described with reference to layers 28 and 22, respectively in FIGS. 1 and 2, illustrates a critical thickness of about 1000 Angstroms where the two-dimensional (2D) and three-dimensional (3D) growth shifts because of the surface energies involved. In order to maintain a true layer by layer growth (Frank Van der Mere growth), the following relationship must be satisfied:

$$\delta_{STO} > (\delta_{INT} + \delta_{GaAs})$$

where the surface energy of the monocrystalline oxide layer 54 must be greater than the surface energy of the amorphous interface layer 58 added to the surface energy of the GaAs layer 66. Since it is impracticable to satisfy this equation, a surfactant containing template was used, as described above with reference to FIGS. 9B–9D, to increase the surface energy of the monocrystalline oxide layer 54 and also to shift the crystalline structure of the template to a diamond-like structure that is in compliance with the original GaAs layer.

Figure 10A:
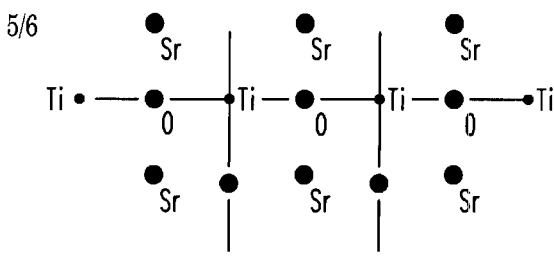
FIGS. 10–10D illustrate a probable molecular bonding structure of the device structures illustrated in FIGS. 9A–9D.
Figure 10B:
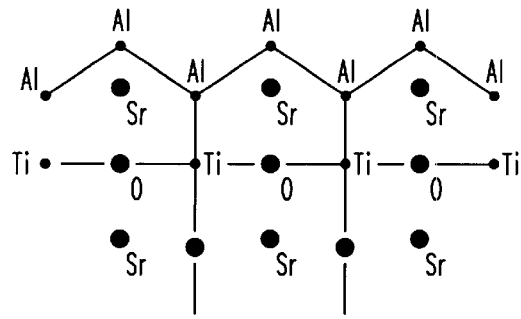
Figure 10C:
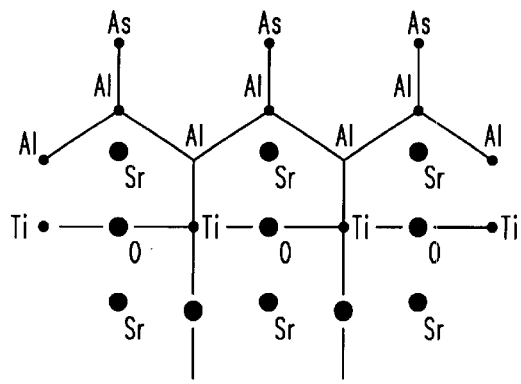
Figure 10D:
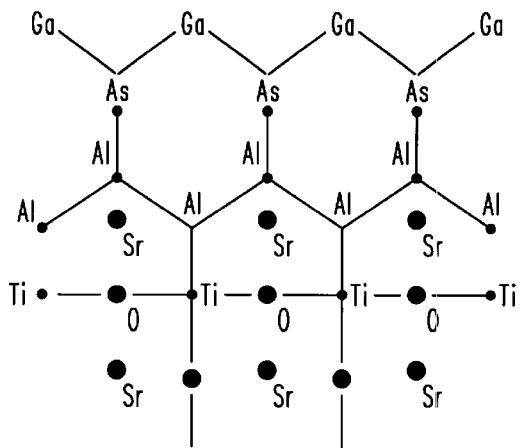

FIG. 10A illustrates the molecular bond structure of a strontium terminated surface of a strontium titanate monocrystalline oxide layer. An aluminum surfactant layer is deposited on top of the strontium terminated surface and bonds with that surface as illustrated in FIG. 10B, which reacts to form a capping layer comprising a monolayer of Al$_2$Sr having the molecular bond structure illustrated in FIG. 10B which forms a diamond-like structure with an sp$^3$ hybrid terminated surface that is compliant with compound semiconductors such as GaAs. The structure is then exposed to As to form a layer of AlAs as shown in FIG. 10C. GaAs is then deposited to complete the molecular bond structure illustrated in FIG. 10D which has been obtained by 2D growth. The GaAs can be grown to any thickness for forming other semiconductor structures, devices, or integrated circuits. Alkaline earth metals such as those in Group IIA are those elements preferably used to form the capping surface of the monocrystalline oxide layer 24 because they are capable of forming a desired molecular structure with aluminum.

Figure 11:
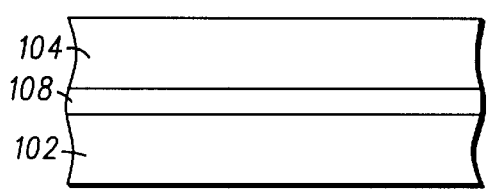
FIGS. 11–13 illustrate schematically, in cross-section, the formation of yet another embodiment of a device structure in accordance with the invention.
Figure 12:
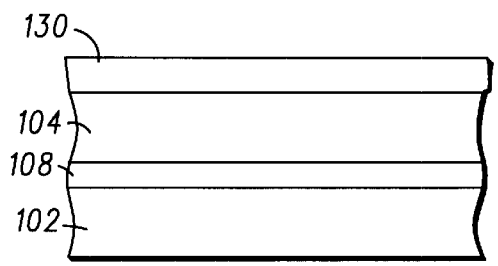
Figure 13:
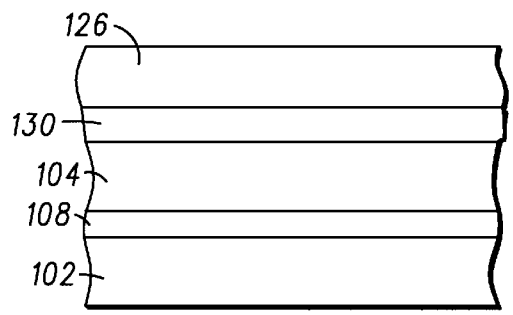

FIGS. 11–13 schematically illustrate, in cross-section, the formation of another embodiment of a device structure in accordance with the invention. This embodiment includes a compliant layer that functions as a transition layer that uses clathrate or Zintl type bonding. More specifically, this embodiment utilizes an intermetallic template layer to reduce the surface energy of the interface between material layers thereby allowing for two dimensional layer by layer growth.

The structure illustrated in FIG. 11 includes a monocrystalline substrate 102, an amorphous interface layer 108 and an accommodating buffer layer 104. Amorphous intermediate layer 108 is grown on substrate 102 at the interface between substrate 102 and accommodating buffer layer 104 as previously described with reference to FIGS. 1 and 2. Amorphous interface layer 108 may comprise any of those materials previously described with reference to amorphous interface layer 28 in FIGS. 1 and 2 but preferably comprises a monocrystalline oxide material such as a monocrystalline layer of Sr$_z$Ba$_{1-z}$TiO$_3$ where z ranges from 0 to 1. Substrate 102 is preferably silicon but may also comprise any of those materials previously described with reference to substrate 22 in FIGS. 1–3.

A template layer 130 is deposited over accommodating buffer layer 104 as illustrated in FIG. 12 and preferably comprises a thin layer of Zintl type phase material composed of metals and metalloids having a great deal of ionic character. As in previously described embodiments, template layer 130 is deposited by way of MBE, CVD, MOCVD, MEE, ALE, PVD, CSD, PLD, or the like to achieve a thickness of one monolayer. Template layer 130 functions as a "soft" layer with non-directional bonding but high crystallinity which absorbs stress build up between layers having lattice mismatch. Materials for template 130 may include, but are not limited to, materials containing Si, Ga, In, and Sb such as, for example, AlSr$_2$, (MgCaYb)Ga$_2$, (Ca,Sr,Eu,Yb)In$_2$, BaGe$_2$As, and SrSn$_2$As$_2$ A monocrystalline material layer 126 is epitaxially grown over template layer 130 to achieve the final structure illustrated in FIG. 13. As a specific example, an SrAl$_2$ layer may be used as template layer 130 and an appropriate monocrystalline material layer 126 such as a compound semiconductor material GaAs is grown over the SrAl$_2$. The Al—Ti (from the accommodating buffer layer of layer of Sr$_z$Ba$_{1-z}$YiO$_3$ where z ranges from 0 to 1) bond is mostly metallic while the Al—As (from the GaAs layer) bond is weakly covalent. The Sr participates in two distinct types of bonding with part of its electric charge going to the oxygen atoms in the lower accommodating buffer layer 104 comprising Sr$_z$Ba$_{1-z}$TiO$_3$ to participate in ionic bonding and the other part of its valence charge being donated to Al in a way that is typically carried out with Zintl phase materials. The amount of the charge transfer depends on the relative electronegativity of elements comprising the template layer 130 as well as on the interatomic distance. In this example, Al assumes an SP$^3$ hybridization and can readily form bonds with monocrystalline material layer 126, which in this example, comprises compound semiconductor material GaAs.

The compliant substrate produced by use of the Zintl type template layer used in this embodiment can absorb a large strain without a significant energy cost. In the above example, the bond strength of the Al is adjusted by changing the volume of the SrAl$_2$ layer thereby making the device tunable for specific applications which include the monolithic integration of III–V and Si devices and the monolithic integration of high-k dielectric materials for CMOS technology.

Clearly, those embodiments specifically describing structures having compound semiconductor portions and Group IV semiconductor portions, are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials as well as other material layers that are used to form those devices with other components that work better or are easily and/or inexpensively formed within semiconductor or compound semiconductor materials. This allows a device to be shrunk, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, a relatively inexpensive "handle" wafer overcomes the fragile nature of compound semiconductor or other monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g. conventional compound semiconductor wafers).

One application of the present invention includes the use of semiconductor structures described above in quantum well infrared photodetectors (QWIPs). QWIPs are typically designed to detect infrared radiation at a particular wavelength and produce a current corresponding to the wavelength absorbed. Recently, multiple quantum well structures using multiple layers of semiconductor materials with alternating band gaps have proven to be applicable in building QWIPs. These QWIPs are based on a layered structure generally containing a plurality of GaAs layers alternating with a plurality of $Al_xGa_{1-x}As$ layers. Although GaAs/$Al_xGa_{1-x}As$ has frequently been used in QWIPs, it will be appreciated that other materials, such as $In_xGa_{1-x}As$/$In_xAl_{1-x}As$, $In_xGa_{1-x}As$/InP, InGaAs/InP and the like, can also be used. A comprehensive description of the theory and design of QWIPs is included in "Quantum-Well Infrared Photodetectors," J. Appl. Phys. 74(8), Oct. 15, 1993, by B. F. Levine.

An advantage of QWIPs is that they have the ability to sense multiple wavelengths of radiation. They also take advantage of the mature GaAs growth and processing technologies. However, conventional QWIPs present several disadvantages, including the high cost of substrate material used to manufacture the QWIPs and the need for separate CMOS circuitry to sense the output of each element. Embodiments of QWIPs of the present invention addresses these disadvantages by using a standard silicon substrate and by coupling the QWIP structure with a conventional circuit to form a one chip solution for infrared detection.

Figure 14:
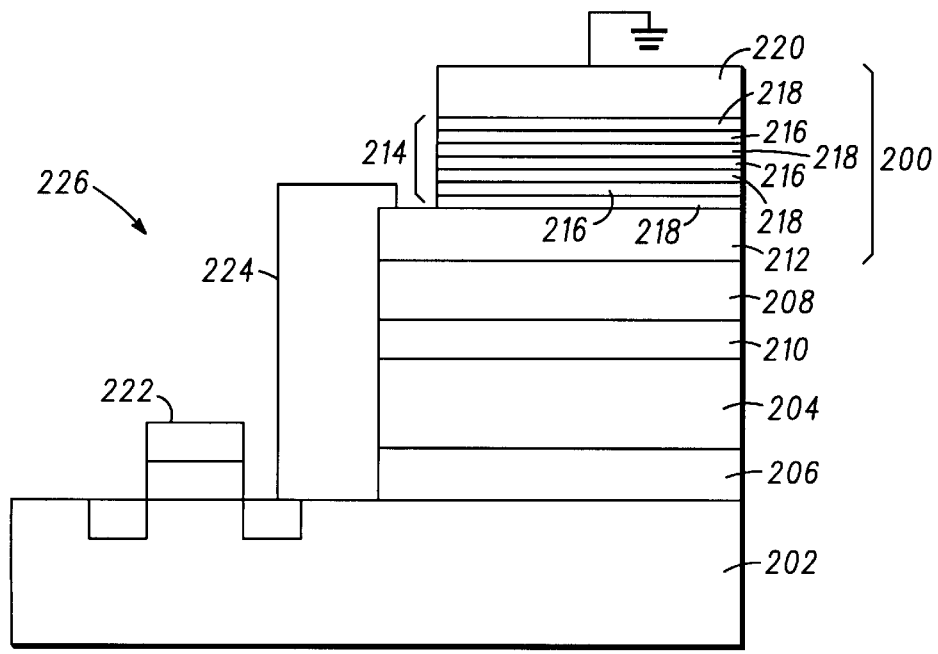
FIG. 14 illustrates schematically, in cross-section, an exemplary embodiment of a quantum well infrared photodetector fabricated on a semiconductor substrate according to the present invention.

FIG. 14 illustrates in cross section an exemplary embodiment of a QWIP 200 in accordance with the present invention. To fabricate QWIP 200, a monocrystalline semiconductor substrate 202 such as silicon functions as the starting material. An accommodating buffer layer 204 is then grown epitaxially over substrate 202 and an amorphous intermediate layer 206 may be formed between substrate 202 and buffer layer 204 by the oxidation of substrate 202 during the growth of buffer layer 204. Buffer layer 204 may be comprised of a monocrystalline oxide or nitride material such as that comprising layer 24, 54 and 104 with reference to FIGS. 1, 9 and 11, respectively. In accordance with one embodiment of the invention (not illustrated), a layer may comprise material from amorphous oxide layer 206 and material from layer 204, which is formed by annealing amorphous intermediate layer 206 and buffer layer 204, forming a layer such as layer 36 described with reference to FIG. 3.

Next, an additional buffer layer 210 is deposited over buffer layer 204. Additional buffer layer 210 may comprise materials such as those comprising layer 32 with reference to FIG. 2 and having low thermal conductivity properties. Alternatively, layer 210 may serve as a template layer formed of materials such as those comprising layer 60 with reference to FIG. 9D, and layer 130 with reference to FIG. 13. A monocrystalline material layer 208 is epitaxially deposited over additional buffer layer 210. Additional buffer layer 210 serves to provide a lattice compensation between buffer layer 204 and monocrystalline material layer 208. Monocrystalline material layer 208 may be comprised of a monocrystalline material such as that comprising layer 26 with reference to FIGS. 1, 2 and 3, layer 66 with reference to FIG. 9D, and layer 126 with reference to FIG. 13. A doped monocrystalline material layer 212 is epitaxially deposited over monocrystalline material layer 208. Layer 212 preferably comprises a doped layer of materials from Groups III and V of the periodic table, such as n++GaAs.

A multiple quantum wells structure 214 is disposed on doped monocrystalline material layer 212. Each quantum well includes an active layer 216 sandwiched between two barrier layers 218. Specific examples of a QWIP described in FIG. 14 include a structure where quantum wells include active layers 218 comprised of n++GaAs sandwiched between barrier layers 218 which are comprised of $Al_xGa_{1-x}$ As, where x ranges from about 0 to 1.0 and is preferably about 0.3. The thickness of active layers 218 preferably ranges from about 20 angstroms to 100 angstroms and is more preferably about 50 angstroms. The thickness of barrier layers 218 preferably ranges from 400 angstroms to 800 angstroms and is preferably 500 angstroms.

An additional doped monocrystalline material layer 220 is then deposited over multiple quantum wells structure 214. Layer 220 may comprise the same materials as in layer 212 and preferably comprises a doped layer of materials from Groups III and V of the periodic table, such as n++GaAs. Layer 220 may then be capped with a layer of metal (not shown) of a thickness ranging from 100 angstroms to 2000 angstroms. The metal layer may comprise Al, TiAu or any suitable metal. The metal layer serves to aid in absorption of infrared radiation and provides for enhanced ohmic contact to layer 220.

QWIP 200 is coupled to CMOS device 222 via electrical connection 224 to form a detector pixal structure 226. CMOS device 222 may comprise a device such as a MOSFET which is formed by conventional semiconductor processing as is well known and widely practiced in the semiconductor industry. To enhance contact between QWIP 200 and CMOS device 222, a metal layer (not shown) may be deposited overlying layer 212 before multiple quantum wells structure 214 is deposited thereon. A plurality of detector pixel structures which detect different wavelengths of infrared radiation may then be combined into a focal plane array which produces an image corresponding to the received infrared radiation.

It should be noted that the steps of epitaxially growing or depositing the various layers includes epitaxially growing or depositing layers by processes such as MBE, MOCVD, MEE, CVD, PVD, PLD, CSD and ALE as previously indicated with respect to the processing steps described above for fabricating the structures shown in FIGS. 1–3. Further, although the present invention has been described using a GaAs/$Al_xGa_{1-x}$A QWIP structure, other alternate QWIP material systems may include but are not limited to $In_xGa_{1-x}As$/$In_xAl_{1-x}As$, $In_xGa_{1-x}As$/InP, InGaAsP/InP, $In_xGa_{1-x}As$/GaAs, GaAs/$Ga_xIn_{1-x}P$ and GaAs/$Al_xIn_{1-x}P$.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, solution to occur or become more pronounced are not to be constructed as critical, required, or essential features or elements of any or all of the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A quantum well infrared photodetector element comprising:

a monocrystalline substrate;

a first layer comprising an accommodating buffer layer of monocrystalline oxide film epitaxially grown overlying the substrate;

an amorphous oxide layer underneath the first layer;

a second layer comprising monocrystalline material overlying the first layer;

a third layer comprising monocrystalline material overlying the second layer;

a multiple quantum well structure disposed adjacent the third layer; and a fourth layer comprising monocrystalline material overlying the multiple quantum well structure.

2. The quantum well infrared photodetector element of claim 1 further comprising an integrated circuit, wherein at least a portion of the integrated circuit is formed in the substrate and is electrically coupled to at least a portion of the multiple quantum well structure.

3. The quantum well infrared photodetector element of claim 1, wherein the substrate comprises silicon.

4. The quantum well infrared photodetector element of claim 1, wherein the first layer comprises an oxide selected from the group consisting of alkaline earth metal titanates, alkaline earth metal zirconates, alkaline earth metal hafnates, alkaline earth metal tantalates, alkaline earth metal ruthenates, alkaline earth metal niobates, and perovskite oxides.

5. The quantum well infrared photodetector element of claim 1, wherein the first layer comprises $Sr_zBa_{1-z}TiO_3$ where z ranges from 0 to 1.

6. The quantum well infrared photodetector element of claim 1, wherein the second layer comprises a compound semiconductor material selected from the group consisting of GaAs, AlGaAs, InP,InGaAs, InGaP, ZnSe and ZnSeS.

7. The quantum well infrared photodetector element of claim 1, wherein the third layer comprises an impurity doped compound semiconductor material selected from the group consisting of GaAs, $Al_xGa_{1-x}As$, InP, $In_xGa_{1-x}As$, $In_xGa_{1-x}P$, ZnSe and ZnSeS.

8. The quantum well infrared photodetector element of claim 1, wherein the multiple quantum well structure comprises alternating active layers and barrier layers, wherein the active layers comprise materials selected from the group consisting of GaAs, $In_xGa_{1-x}As$, and InGaAsP, and the barrier layers comprise materials selected from the group consisting of $Al_xGa_{1-x}As$, $In_xGa_{1-x}As$, InP, GaAs, $In_xGa_{1-x}P$, and $Al_xIn_{1-x}P$, where x ranges from approximately 0 to 1.

9. The quantum well infrared photodetector element of claim 1, wherein the fourth layer comprises an impurity doped compound semiconductor material selected from the group consisting of GaAs, $Al_xGa_{1-x}As$, InP, $In_xGa_{1-x}As$, $In_xGa_{1-x}P$, ZnSe and ZnSeS, where x ranges from 0 to 1.

10. The quantum well infrared photodetector element of claim 1, further comprising a metal layer overlying the fourth layer.

11. The quantum well infrared photodetector element of claim 1, further comprising a fifth layer positioned between the first layer and the second layer, wherein the fifth layer comprises an additional buffer layer.

12. The quantum well infrared photodetector element of claim 1, further comprising a template layer positioned between the first layer and the second layer.

13. The quantum well infrared photodetector element of claim 12, wherein the template layer comprises a Zintl-type phase material.

14. The quantum well infrared photodetector element of claim 13, wherein the Zintltype phase material comprises at least one of $SrAl_2$, $(MgCaYb)Ga_2$, $(Ca, Sr, Eu, Yb) In_2$, $BaGe_2As$, and $SrSn_2As_2$.

15. The quantum well infrared photodetector element of claim 12, wherein the template layer comprises a surfactant material.

16. The quantum well infrared photodetector element of claim 15, wherein the surfactant material comprises at least one of Al, In, and Ga.

17. The quantum well infrared photodetector element of claim 15, wherein the template layer further comprises a capping layer.

18. The quantum well infrared photodetector element of claim 17, wherein the capping layer is formed by exposing the surfactant material to a cap-inducing material.

19. The quantum well infrared photodetector element of claim 18, wherein the cap-inducing material comprises at least one of As, P, Sb, and N.

20. The quantum well infrared photodetector element of claim 17, wherein the surfactant comprises Al, the capping layer comprises $Al_2Sr$ and the second layer comprises GaAs.

21. The quantum well infrared photodetector element of claim 1, wherein the first layer comprises an oxide formed as a monocrystalline oxide which is subsequently heat treated to convert at least a portion of the monocrystalline oxide to an amorphous oxide.

22. The quantum well infrared photodetector element of claim 1, wherein the monocrystalline substrate is characterized by a first lattice constant and the first layer is characterized by a second lattice constant different than the first lattice constant.

23. The quantum well infrared photodetector element of claim 22, wherein the second layer is characterized by a third lattice constant different than the second lattice constant.

24. The quantum well infrared photodetector element of claim 1, wherein the monocrystalline substrate is characterized by a first crystalline orientation and the monocrystalline oxide is characterized by a second crystalline orientation and, wherein the second crystalline orientation is rotated with respect to the first crystalline orientation.

25. A quantum well infrared photodetector circuit comprising:

a monocrystalline silicon substrate;

a portion of an MOS circuit formed in the silicon substrate;

a first layer of monocrystalline oxide material selected from the group consisting of alkaline earth metal titanates, alkaline earth metal zirconates, alkaline earth metal hafnates, alkaline earth metal tantalates, alkaline earth metal ruthenates, alkaline earth metal niobates, and perovskite oxides;

an amorphous silicon oxide strain relief layer formed between the monocrystalline oxide layer and the silicon substrate;

a second layer of monocrystalline material selected from the group consisting of GaAs, AlGaAs, InP, InGaAs, InGaP, ZnSe and ZnSeS overlying the first layers;

a third layer of impurity doped monocrystalline material selected from the group consisting of GaAs, $Al_xGa_{1-x}$ As, InP, $In_xGa_{1-x}As$, $In_xGa_{1-x}P$, ZnSe and ZnSeS where x ranges from 0 to 1;

a multiple quantum well structure disposed adjacent said third layer;

a fourth layer of impurity doped monocrystalline material selected from the group consisting of GaAs, $Al_xGa_{1-x}As$, InP, $In_xGa_{1-x}As$, $In_xGa_{1-x}P$, ZnSe and ZnSeS where x ranges from 0 to 1; and an electrical connection electrically coupling the portion of an MOS circuit and the multiple quantum well structure.

26. The quantum well infrared photodetector circuit of claim 25, wherein the first layer comprises $Sr_zBa_{1-z}TiO_3$ where z ranges from 0 to 1.

27. The quantum well infrared photodetector circuit of claim 25, wherein the multiple quantum well structure comprises alternating active layers and barrier layers, wherein the active layers comprise materials selected from the group consisting GaAs, $In_xGa_{1-x}As$, and InGaAsP, where x ranges from approximately 0 to 1, and the barrier layers comprise materials selected from the group consisting of $Al_zGa_{1-z}As$, $In_zGa_{1-z}As$, InP, GaAs, $In_zGa_{1-z}P$, and $Al_zIn_{1-z}P$, where z ranges from approximately 0 to 1.

28. The quantum well infrared photodetector circuit of claim 25, further comprising a metal layer overlying the fourth layer.

29. The quantum well infrared photodetector circuit of claim 25, further comprising a fifth layer positioned between the first layer and the second layer, wherein the fifth layer comprises an additional buffer layer.

30. The quantum well infrared photodetector circuit of claim 25 further comprising a template layer positioned between the first layer and the second layer.

31. The quantum well infrared photodetector circuit of claim 30, wherein the template layer comprises a Zintl-type phase material.

32. The quantum well infrared photodetector circuit of claim 31, wherein the Zintl-type phase material comprises at least one of $SrAl_2$, $(MgCaYb)Ga_2$, $(Ca, Sr, Eu, Yb) In_2$, $BaGe_2As$, and $SrSnAs_2$.

33. The quantum well infrared photodetector circuit of claim 30, wherein the template layer comprises a surfactant material.

34. The quantum well infrared photodetector circuit of claim 33, wherein the surfactant comprises at least one of Al, In, and Ga.

35. The quantum well infrared photodetector circuit of claim 33, wherein the template layer further comprises a capping layer.

36. The quantum well infrared photodetector circuit of claim 35, wherein the capping layer is formed by exposing the surfactant material to a cap-inducing material.

37. The quantum well infrared photodetector circuit of claim 36, wherein the cap-inducing material comprises at least one of As, P, Sb and N.

38. The quantum well infrared photodetector circuit of claim 35, wherein the surfactant material comprises Al, the capping layer comprising $Al_2Sr$ and the second layer comprises GaAs.

39. A quantum well infrared photodetector element comprising:

a monocrystalline silicon substrate;

a first layer comprising an accommodating buffer layer of monocrystalline oxide epitaxially grown overlying the silicon substrate, wherein the monocrystalline oxide is selected from the group consisting of alkaline earth metals and perovskite oxides;

an amorphous oxide layer underneath the first layer;

a second layer comprising monocrystalline material overlying the first layer;

a template layer positioned between the first layer and the second layer a third layer comprising monocrystalline material overlying the second layer;

a multiple quantum well structure disposed adjacent the third layer; and a fourth layer comprising monocrystalline material overlying the multiple quantum well structure; and an additional buffer layer positioned between the first layer and the second layer.

* * * * *